United States Patent [19]

Ushida

[11] Patent Number: 4,984,215
[45] Date of Patent: Jan. 8, 1991

[54] SEMICONDUCTOR MEMORY DEVICE

[75] Inventor: Yuki Ushida, Tokyo, Japan

[73] Assignee: Oki Electric Industry Co., Inc., Japan

[21] Appl. No.: 374,291

[22] Filed: Jun. 29, 1989

[30] Foreign Application Priority Data

Jul. 4, 1988 [JP] Japan .................................. 63-166290

[51] Int. Cl.$^5$ ............................................ G11C 11/34
[52] U.S. Cl. ............................ 365/230.06; 365/189.11
[58] Field of Search .............. 365/239, 230.06, 230.09, 365/203, 189.11

[56] References Cited

FOREIGN PATENT DOCUMENTS 63-3744288 2/1988 Japan .

Primary Examiner—Joseph A. Popek
Attorney, Agent, or Firm—Edward D. Manzo

[57] ABSTRACT

In a semiconductor memory device comprising a memory cell matrix having memory cells connected to word lines and bit lines and arranged in rows and columns, an initialize circuit is responsive to an initialize signal to set all the bit lines to predefined one of High level and Low level, and to raise the word line selected by the output of a row address decoder and then to raise other word lines sequentially. As a result, the memory cells are initialized sequentially word line by word line.

9 Claims, 3 Drawing Sheets

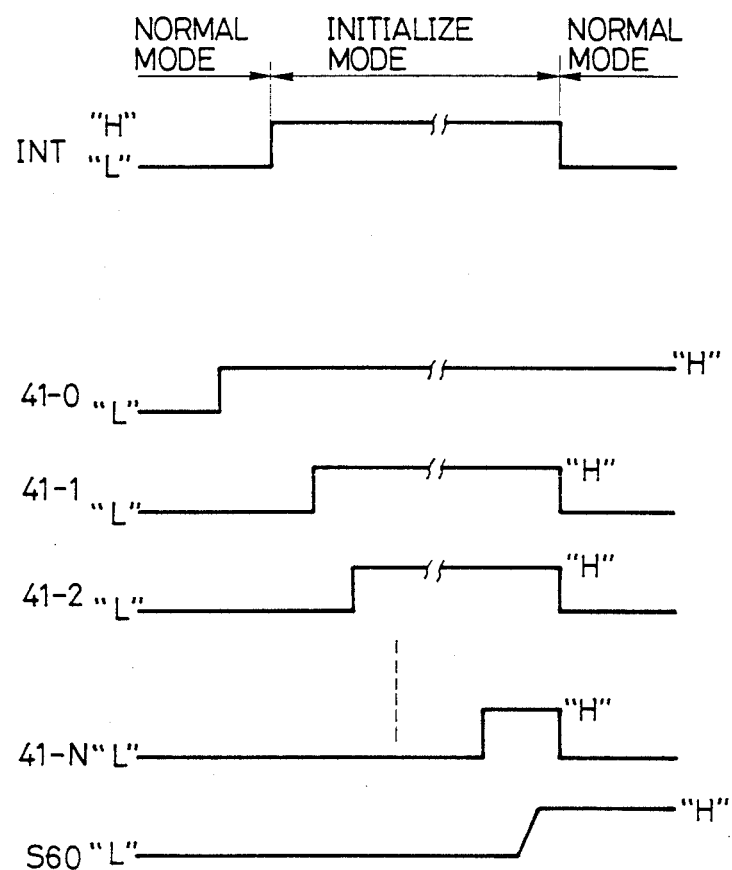

SEMICONDUCTOR MEMORY DEVICE

BACKGROUND OF THE INVENTION

The present invention relates to a semiconductor memory device, such as a static RAM (random access memory) having initialization function.

An example of prior-art memory of this type is shown in Japanese Patent Application Kokai Publication No. 37442/1988. In this prior art scheme, all the memory cells are initialized simultaneously. A disadvantage arising from this scheme is that bit lines must be set to the ground potential and therefore the control for the initialization is complex. Moreover, excessive currents may flow through the bit lines when all the memory cells are simultaneously initialized, and the bit lines may be damaged by fusiondisconnection.

In another prior art, the row address decoder is used to sequentially select the word lines to write "0". This prolongs the time required for the initialization.

SUMMARY OF THE INVENTION

An object of the invention is to eliminate the above problems.

Another object of the invention is to provide a memory device with a simple control over initialization.

Another object of the invention is to avoid excessive currents through the bit lines.

According to the invention, there is provided a semiconductor memory device comprising:

a memory cell matrix having memory cells connected to word lines and bit lines and arranged in rows and columns to form a matrix;

a row address decoder for decoding row address signals to supply row decodes outputs to the respective word lines for selecting one of the word lines;

a column address decoder for decoding column address signals to select one of the bit lines; and an initialize circuit responsive to an initialize signal to set all the bit lines at a predefined initial level, and to cause the word line being selected by the outputs of the row address decoder to be in the active state, and then to cause the other word lines to be in the active state sequentially.

BRIEF DESCRIPTION OF THE DRAWINGS

FIG. 3 is a time chart showing the operation of the memory device shown in FIG. 2.

DETAILED DESCRIPTION OF THE EMBODIMENTS

Figure 1:
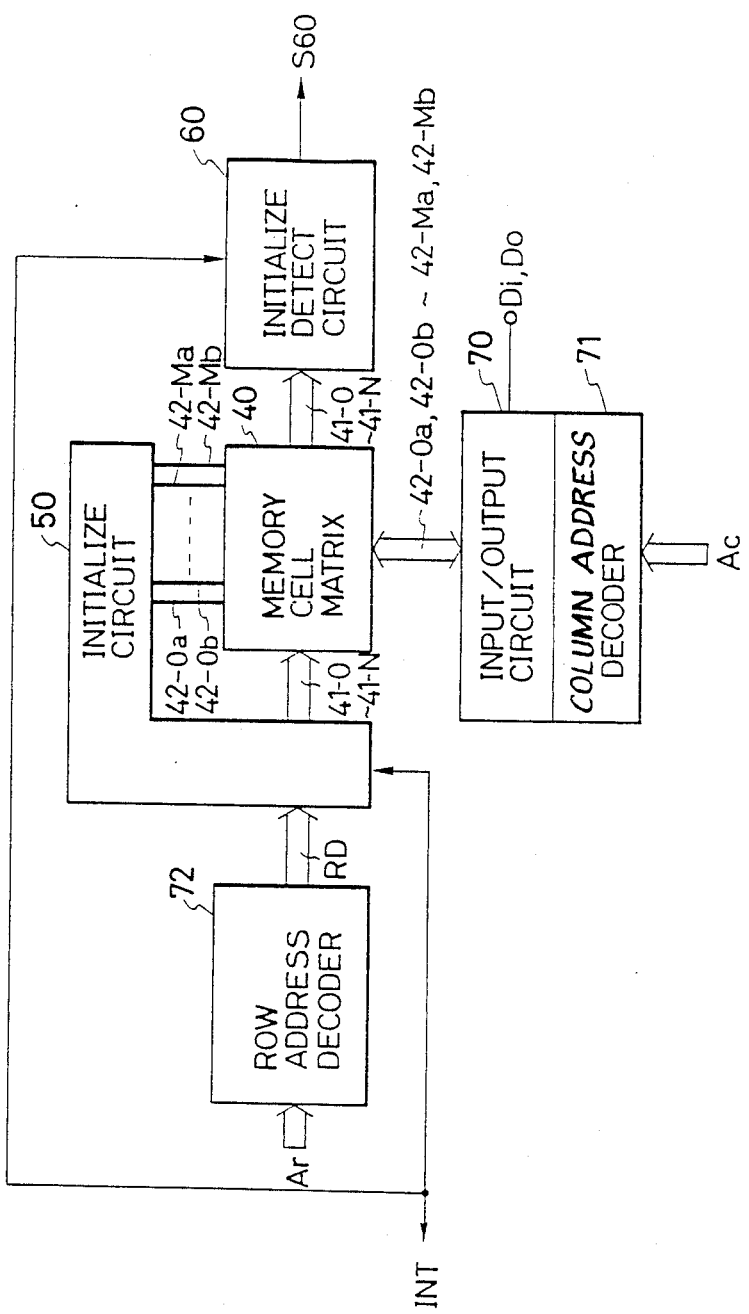
FIG. 1 is a block diagram showing the overall scheme of a semiconductor memory device according to the invention.

The semiconductor memory device illustrated in FIG. 1 is a static RAM and comprises a memory cell matrix 40 for storing data. The memory cell matrix 40 comprises a plurality of word lines 41-0 to 41-N, and a plurality of complementary bit lines 42-0a, 42-0b to 42-Ma, 42-Mb. Memory cells 43 are connected at the intersections of these word lines and the bit lines to form a matrix. The word lines 41-0 to 41-N and the bit lines 42-0a, 42-0b to 42-Ma, 42-Mb are connected to an initialize circuit 50, an initialize detect circuit 60, an input/output circuit 70 and a column address decoder 71, and the initialize circuit 50 is connected to a row address decoder 72.

The initialize circuit 50 is responsive to an external initialize signal INT being High, initializes to "0" (Low) or "1" (High) the memory cells successively, word line by word line.

The initialize detect circuit 60 receives the initialize signal INT and the signals on the word lines 41-0 to 41-N, and when all the word lines 41-0 to 41-N are High while the initialize signal INT is HIGH, it produces a High-detect signal S60.

The column address decoder 71 decodes the column address Ac and selects the pairs of bit lines 42-0a, 42-0b to 42-Ma, 42-Mb. It enables input of write data Di from the input/output circuit 70 into the selected one of the pairs of bit lines 42-0a, 42-0b to 42-Ma, 42-Mb or output of read data Do to the input/output circuit 70 from the selected one of the pairs of bit lines 42-0a, 42-0b to 42-Ma, 42-Mb.

The row address decoder 72 decodes the row address signal Ar and supplies the decode outputs RD for the respective word lines to the initialize circuit 50.

Figure 2:
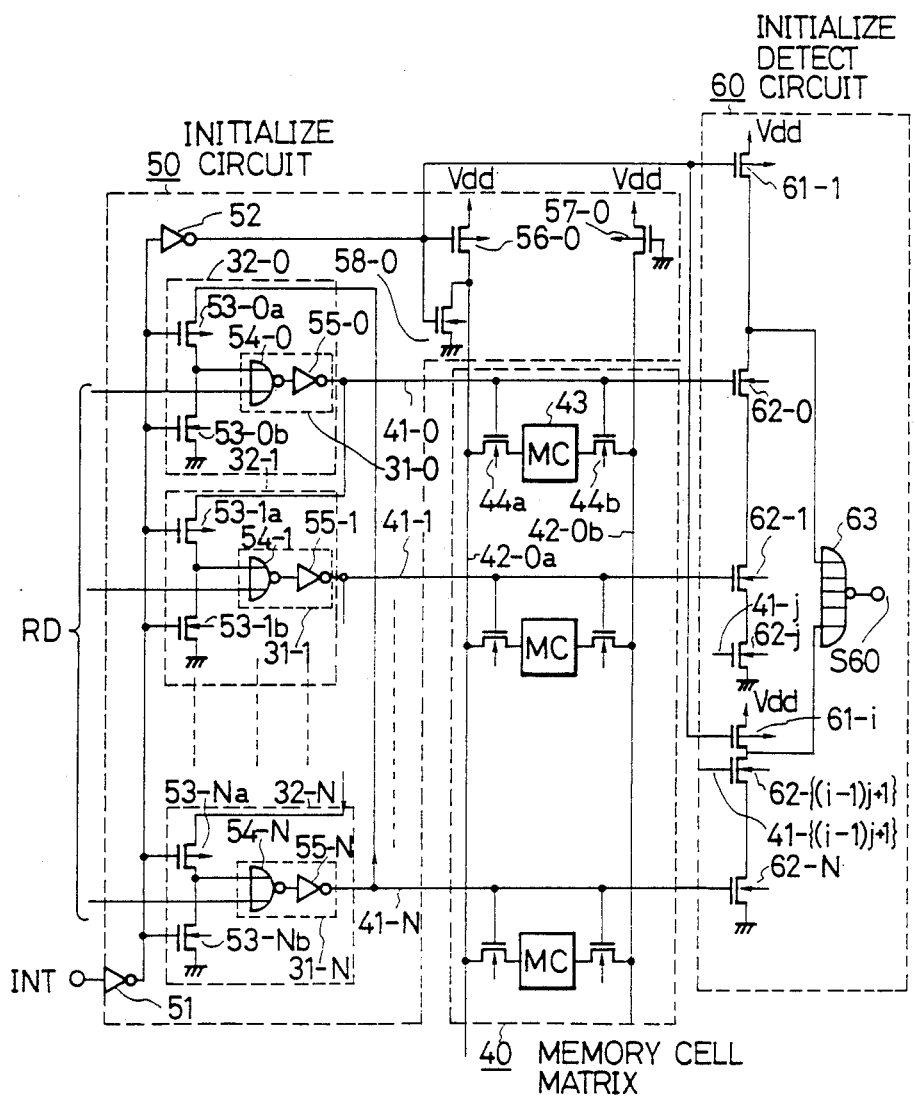
FIG. 2 is a circuit diagram showing part of the semiconductor memory device of an embodiment of the invention.

Configuration of the memory cell matrix 40, the initialize circuit 50, and the initialize detect circuit 60 will now be described with reference to FIG. 2.

For the purpose of simplifying illustration, only one pair of bit lines 42-0a, 42-0b are shown. As illustrated, memory cells 43 each comprising a flip-flop are connected through transfer gates 44a, 44b at the intersections between the pair of bit lines 42-0a, 42-0b and the word lines 41-0 to 41-N.

The initialize circuit 50 comprises inverters 51, 52, PMOS transistors 53-0a to 53-Na, NMOS transistors 53-0b to 53-Nb, NOR gates 54-0 to 54-N, inverters 55-0 to 55-N, a precharge PMOS transistor 56-0, a load PMOS transistor 57-0 and a "0" write NMOS transistor 58-0.

The NOR gates 54-0 to 54-N and the inverters 55-0 to 55-N are provided in association with the respective word lines 41-0 to 41-N, and their combinations form OR gate circuits 31-0 to 31-N.

These OR gate circuits 31-0 to 31-N, the PMOS transistors 53-0a to 53-Na, and the NMOS transistors 53-0b to 53-Nb form logical gates 32-1 to 32-N for the respective word lines, each logic gate being responsive to the output RD of the row address decoder, the initialize signal INT, and the state of adjacent, immediately preceding word line (or in the case of the topmost word line 41-0, the word line 41-N at the bottom of the memory cell matrix), for raising the associated word line to be High when said associated word line is selected by the row address decoder or when the initialize signal is in the active state and said another word line is High.

The initialize signal INT is connected through the inverter 51 to the inverter 52, the gates of the PMOS transistors 53-0a to 53-Na, and the gates of the NMOS transistors 53-0b to 53-Nb. The PMOS transistors 53-0a to 53-Na and the NMOS transistors 53-0b to 53Nb are connected in series to the ground. The nodes joining the PMOS transistors 53-0a to 53Na and the NMOS transistors 53-0b to 53Nb are connected to first inputs of NOR gates 54-0 to 54-N. Second inputs of the NOR gates 54-0 to 54-N are connected to the outputs RD of the row address decoder 72. The outputs of the NOR gates 54-0 to 54-N are connected through the inverters 55-0 to 55-N to the word lines 41-0 to 41-N. First ends of the PMOS transistors 53-1a to 53-Na are connected to the adjacent, immediately preceding word lines 41-0 to 41-(N-1), respectively. The first end of the PMOS transistor 53-0 at one end of the memory cell matrix is connected to the word line 41-N at the opposite end of the memory cell matrix. The PMOS transistors 53-0a to 53-Na, the NMOS transistors 53-0b to 53-Nb, the NOR gates 54-0 to 54-N, and the inverters 55-0 to 55-N have a function of switching between the outputs RD of the row address decoder 72 and the initialize signal INT, and a function of sequentially selecting the word lines 41-0 to 41-N.

The output of the inverter 52 is connected to the gates of the PMOS transistor 56-0 and the NMOS transistor 58-0. The PMOS transistor 56-0 is connected between the power supply Vdd and one 42-0a of the pair of bit lines, while the NMOS transistor 58-0 is connected between the bit line 42-0a and the ground. The PMOS transistor 57-0 is connected between the other bit line 42-0b of the pair and the ground. The gate of the PMOS transistor 57-0 is connected to the ground.

The initialize detect circuit 60 comprises a precharge PMOS transistor 61-1 to 61-i, NMOS transistors 62-0 to 62-N and a NOR gate 63. The gates of the NMOS transistors 62-0 to 62-N are connected to the word lines 41-0 to 41-N, respectively. The NMOS transistors 62-0 to 62-N are divided into i groups, each group comprising j NMOS transistors connected in series with each other and with the PMOS transistors 61-1 to 61-i, respectively. The PMOS transistor 61-1 and the NMOS transistors 62-0 to 62-j are connected in series with each other and between the power supply Vdd and the ground. The gate of the PMOS transistor 61-1 is connected to the output of the inverter 52. The PMOS transistors 61-1 to 61-i have one ends connected to the power supply Vdd and the other ends connected to the inputs of the NOR gate 63. The output of the NOR gate 63 forms the detect signal S60.

The operation of the device shown in FIG. 2 and FIG. 1 will now be described with reference to FIG. 3.

When the initialize signal INT is Low indicating the normal mode, the output of the inverter 51 is High, and the PMOS transistors 53-0a to 53-Na are off and the NMOS transistors 53-0b to 53-Nb are on. First inputs of the NOR gates 54-0 to 54-N connected to the NMOS transistors 53-0b to 53-Nb are Low, and the outputs RD of the row address decoder 72 are connected to the word lines 41-0 to 41-N through the NOR gates 54-0 to 54-N and the inverters 55-0 to 55-N. When the output of the inverter 51 is High, the output of the inverter 52 is Low and the PMOS transistor 56-0 is on and the NMOS transistor 58-0 is off, and the PMOS transistor 61-1 to 61-i are on. When the PMOS transistor 56-0 is on, the bit line 42-0a is precharged with the power supply voltage Vdd to become High. When the PMOS transistors 61-1 to 61-i are on, the detect signal S60 output from the NOR gate 63 is Low.

When the outputs RD of the row address decoder 72 are connected to the word lines 41-0 to 41-N, reading and writing of data are enabled. That is, when data is to be read from the memory cell matrix 40, the row address signal Ar is decoded by the row address decoder 72 and its outputs RD selectively raises one of the word lines 41-0 to 41-N, e.g., the word line 41-0, to High. When the word line 41-0 goes High, the transfer gates 44a, 44b, etc. are turned on, and data stored in the memory cells 43 are transferred to the respective pairs of bit lines 42-0a, 42-0b to 42-Ma, 42-Mb. The column address decoder 71 decodes the column address signal Ac to select one of the pairs of the bit lines 42-0a, 42-0b to 42Ma, 42-Mb. The input/output circuit 70 then reads the data on the pair of bit lines 42-0a, 42-0b and outputs it as read data Do.

When data is to be written, the row address decoder 72 and the column address decoder 71 select the memory cell 43, and data Di input through the input/output circuit 70 is stored in the selected memory cell 43.

Let us now assume that the initialize signal INT is High indicating the initialize mode.

In a static RAM it is usual that at all times one of the word lines is selected. Assume that the word lines 41-0 is initially selected and is High. When the initialize signal INT goes High, the output of the inverter 51 goes Low, and the output of the inverter 52 goes High, and the PMOS transistors 53-0a to 53-Na are turned on, the NMOS transistors 53-0b to 53-Nb are turned off, the PMOS transistor 56-0 is turned off, and the NMOS transistor 58-0 is turned on. When the PMOS transistor 56-0 is off and the NMOS transistor 58-0 is on, "Low" is written onto the pairs of bit lines 42-0a, 42-0b to 42-Ma, 42-Mb through the transfer gates 44a, 44b connected to the word line 41-0, and "Low" is written in the memory cells 43 connected to the word line 41-0, i.e., the memory cells 43 connected to the word line 41-0 are initialized.

"High" on the word line 41-0 is supplied through the PMOS transistor 53-1a to the NOR gate 54-1, the output of which therefore goes Low, and the output of the inverter 55-1 goes High, and the word line 41-1 is selected. This selection of the word line 41-0 takes place a certain delay time, corresponding to the propagation delay of the logic gates. When the word line 41-1 is selected, the memory cells 43 connected thereto are initialized in the same way as above. By repetition of such operation, the word lines 41-0 to 41-N are sequentially selected in turn in the order from the word line 41-0 to the word line 41-N, and the memory cells connected to the respective word lines are initialized in turn.

When the word lines 41-0 to 41-N are sequentially selected, the NMOS transistors 62-0 62-N are sequentially turned on. When all the word lines 41-0 to 41-N are High, or in the active state, the detect signal S60 output from the NOR gate 63 changes from Low to High.

In the above description, the word line 41-0 is initialized first. But because the word line selecting means comprising the PMOS transistors 53-0a to 53-Na, the NMOS transistors 53-0b to 53-Nb, the NOR gates 54-0 to 54-N and the inverters 55-0 to 55-N has a form of a ring, the initialization can be started with any of the word lines 41-0 to 41-N.

The above embodiment has the following advantages:

(i) When the initialize signal INT goes from Low to High, the initialize circuit 50 starts sequentially selecting the word lines 41-0 to 41-N and initializing the memory cells 43 word line by word line. The control for the initialization is therefore simple. Moreover, variation in the current flowing through the pairs of bit lines 42-0a, 42-0b 42-Ma, 42-Mb can be reduced, so fusion-disconnection of the bit lines due to excessive currents and other troubles can be prevented. Furthermore, since no excessive currents flow, the write NMOS transistor 58-0 can be reduced in size, so the chip area can be reduced. In addition, the dimensions of the write NMOS transistor 58-0 can be set independently from the number of word lines, the designing is facilitated.

(ii) Since the initialize circuit 50 is used to sequentially initialize the word lines 41-0 to 41-N, the time required for the initialization is longer than in the first prior art scheme in which all the memory cells are initialized simultaneously, but is shorter than the second prior art scheme in which the word lines are sequentially initialized by the row address decoder.

(iii) Since the initialize detect circuit 60 is provided, completion of the initialization can be detected from Low to High transition of the detect signal S60 output from the initialize detect circuit 60, and transition to the next access cycle can be made at a higher speed. Moreover, when the detect signal S60 need not be produced outside, it may be so arranged that the detect signal S60 is not produced outside, and be used only for internal processing.

The invention is not limited to the embodiment described above, and encompasses various modifications as exemplified below.

(a) The circuit shown in FIG. 1 can be modified into other forms or to include additional circuit components.

(b) In the embodiment described, the NMOS transistor 58-0 is used to write "0" in the memory cells 43. But it may be so arranged that the NMOS transistor 58-0 is replaced by a PMOS transistor and "1" is written for the initialization.

(c) The word line selecting means of the initialize circuit 50 may alternatively be configured from other transistors, gate circuits and the like. Similarly, the initialize detect circuit 60 can be configured from other transistors, gate circuits and the like.

As has been described, according to the invention, the initialize circuit sequentially selects the word lines and initializes the memory cells word line by word line. The control for the initialization is therefore simple. Moreover, since no excessive currents flow, the size of the elements for the initialization can be reduced, and the size can be set independently from the number of the word lines. Moreover, because of the provision of the initialize detect circuit completion of the initialization can be detected and transition to the next cycle can be speeded up.

What is claimed is:

1. A semiconductor memory device comprising:
   a memory cell matrix having memory cells connected to word lines and bit lines and arranged in rows and columns to form a matrix;
   a row address decoder for decoding row address signals to supply decode outputs to the respective word lines for selecting one of the word lines to cause the selected word line to be in the active state;
   a column address decoder for decoding column address signals to select one of the bit lines; and
   an initialize circuit responsive to an initialize signal to set all the bit lines at a predefined initial level, and to cause the word lines other than said selected word line to be in the active state sequentially.

2. A memory device according to claim 1, further comprising an initialization detect circuit responsive to the initialize signal to output a detect signal when all the word lines are in said active state.

3. A memory device according to claim 1, wherein said initialize circuit comprises:
   logic gates associated with the respective word lines, each logic gate associated being responsive to the output of the row address decoder, the initialize signal, and the state of another word line, for causing the associated word line to be in an active state when said associated word line is selected by the row address decoder or when the initialize signal is in the active state and said another word line is in the active state.

4. A memory device according to claim 3, wherein said another word line is adjacent to said selected work line, or is located at the opposite end of said matrix where said selected word line is located at one end of said matrix.

5. A memory device according to claim 3, wherein each of said logic gates comprises
   a MOS transistor having source and drain terminals, one of which is coupled to said another word line and being controlled by the initialize signal so as to be ON when the initialize signal is in the active state; and
   a logical OR gate circuit having a first input connected to a second one of the source/drain terminals of said MOS transistor, and receiving, at a second input thereof, the output of said row address decoder.

6. A memory device according to claim 5, wherein said OR gate circuit comprises a NOR gate having a first input terminal connected to said second one of the source/drain terminals and a second input terminal receiving the output of the row address decoder, and an inverter receiving the output of the NOR gate, the output of the inverter forming the output of the OR gate circuit.

7. A memory device according to claim 5, where each of said logic gates further comprises an additional MOS transistor having source and drain terminals, one of which is coupled to said second input of said OR gate circuit, and having a second one of the source/drain terminals connected to a node in the inactive state, and controlled by said initialize signal so as to be ON when the initialize signal is not in the active state.

8. A memory device according to claim 3, wherein each of said logic gates has a propagation delay.

9. A semiconductor memory method comprising a device having a memory cell matrix having memory cells connected to word lines and bit lines and arranged in rows and columns to form a matrix, a row address decoder for decoding row address signals to supply decode outputs to the respective word lines for selecting one of the word lines to cause the selected word line to be in the active state, a column address decoder for decoding column address signals to select one of the bit lines, comprising the steps of:
   selecting a word line by said row address decoder to activate said selected word line;
   turning an initialize signal ON;
   activating a first word line next to said selected word line;
   activating a second word line next to said first word line;
   activating a third word line next to said second word line.

* * * * *